United States Patent
Nickel

(10) Patent No.: US 7,196,955 B2
(45) Date of Patent: Mar. 27, 2007

(54) HARDMASKS FOR PROVIDING THERMALLY ASSISTED SWITCHING OF MAGNETIC MEMORY ELEMENTS

(75) Inventor: Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 326 days.

(21) Appl. No.: 11/034,419

(22) Filed: Jan. 12, 2005

(65) Prior Publication Data

US 2006/0152967 A1 Jul. 13, 2006

(51) Int. Cl.
*G11C 11/15* (2006.01)
*H01L 21/64* (2006.01)

(52) U.S. Cl. ............... 365/211; 365/173; 365/171; 365/158; 365/230.07; 438/3

(58) Field of Classification Search ........... 365/173, 365/171, 158, 211, 230.06, 230.07; 438/3, 438/238
See application file for complete search history.

(56) References Cited

U.S. PATENT DOCUMENTS

| | | | |
|---|---|---|---|
| 6,385,082 B1 * | 5/2002 | Abraham et al. | 365/171 |
| 6,603,678 B2 * | 8/2003 | Nickel et al. | 365/171 |
| 6,633,497 B2 | 10/2003 | Nickel | 365/158 |
| 6,704,220 B2 * | 3/2004 | Leuschner | 365/173 |
| 6,724,674 B2 * | 4/2004 | Abraham et al. | 365/211 |
| 6,930,369 B2 * | 8/2005 | Nickel et al. | 257/421 |
| 6,933,239 B2 * | 8/2005 | Ying et al. | 438/706 |
| 6,961,263 B2 * | 11/2005 | Smith et al. | 365/158 |
| 7,105,361 B2 * | 9/2006 | Chen et al. | 438/3 |
| 7,161,875 B2 * | 1/2007 | Sharma | 369/13.05 |

* cited by examiner

*Primary Examiner*—Andrew Q. Tran

(57) ABSTRACT

An exemplary magnetic random access memory comprises a plurality of hardmasks, a plurality of magnetic memory elements each having been formed using a corresponding one of the hardmasks, and at least one conductor near the hardmasks. The conductor is capable of carrying a current to generate radio frequency electromagnetic fields absorbable by the hardmasks to heat the hardmasks to elevate the temperature of one or more of the magnetic memory elements to thermally assist in switching a magnetic orientation thereof.

19 Claims, 9 Drawing Sheets

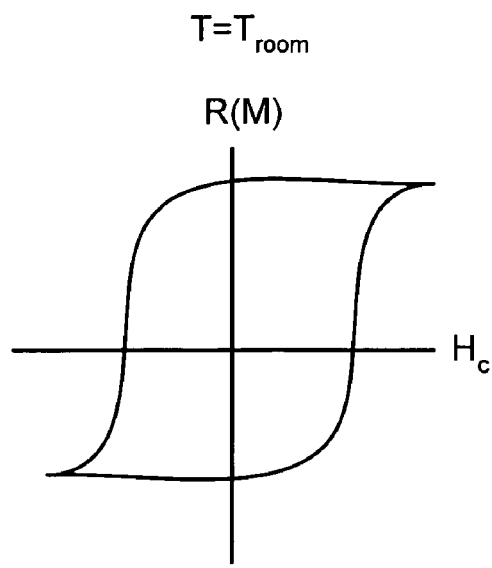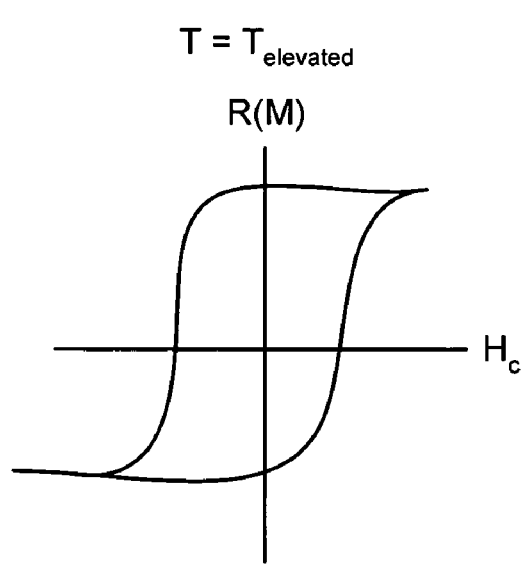
FIG. 3A  FIG. 3B

HARDMASKS FOR PROVIDING THERMALLY ASSISTED SWITCHING OF MAGNETIC MEMORY ELEMENTS

BACKGROUND

A memory chip generally comprises a plurality of memory elements that are deposited onto a silicon wafer and addressable via an array of column conducting leads (bit lines) and row conducting leads (word lines). Typically, a memory element is situated at the intersection of a bit line and a word line. The memory elements are controlled by specialized circuits that perform functions such as identifying rows and columns from which data are read or to which data are written. Typically, each memory element stores data in the form of a "1" or a "0," representing a bit of data.

An array of magnetic memory elements can be referred to as a magnetic random access memory or MRAM. MRAM is generally nonvolatile memory (i.e., a solid state chip that retains data when power is turned off). FIG. 1 illustrates an exemplary magnetic memory element 100 of a MRAM in the related art. The magnetic memory element 100 includes a data layer 110 and a reference layer 130, separated from each other by at least one intermediate layer 120. The data layer 110 may also be referred to as a bit layer, a storage layer, or a sense layer. In a magnetic memory element, a bit of data (e.g., a "1" or "0") may be stored by "writing" into the data layer 110 via one or more conducting leads (e.g., a bit line and a word line). A typical data layer 110 might be made of one or more ferromagnetic materials. The write operation is typically accomplished via write currents that create two external magnetic fields that, when combined, set the orientation of the magnetic moment in the data layer to a predetermined direction.

Once written, the stored bit of data may be read by providing a read current through one or more conducting leads (e.g., a read line) to the magnetic memory element. For each memory element, the orientations of the magnetic moments of the data layer 110 and the reference layer 130 are either parallel (in the same direction) or anti-parallel (in different directions) to each other. The degree of parallelism affects the resistance of the element, and this resistance can be determined by sensing (e.g., via a sense amplifier) an output current or voltage produced by the memory element in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

The intermediate layer 120, which may also be referred to as a spacer layer, may comprise insulating material (e.g., dielectric), non-magnetic conductive material, and/or other known materials.

The layers described above and their respective characteristics are typical of magnetic memory elements based on tunneling magnetoresistance (TMR) effects known in the art. Other combinations of layers and characteristics may also be used to make magnetic memory elements based on TMR effects.

Still other configurations of magnetic memory elements are based on other well known physical effects (e.g., giant magnetoresistance (GMR), anisotropic magnetoresistance (AMR), colossal magnetoresistance (CMR), and/or other physical effects).

Throughout this application, various exemplary embodiments will be described in reference to the TMR memory elements as first described above. Those skilled in the art will readily appreciate that the exemplary embodiments may also be implemented with other types of magnetic memory elements known in the art (e.g., other types of TMR memory elements, GMR memory elements, AMR memory elements, CMR memory elements, etc.) according to the requirements of a particular implementation.

The various conducting leads (e.g., bit lines, word lines, and read lines) which are used to select the memory elements in a MRAM, and to read data from or write data to the memory elements are provided by one or more additional layers, called conducting layer(s). FIG. 2 illustrates an exemplary memory array 200 including magnetic memory elements 100a–100d that are selectable by bit lines 210a–210b, word lines 220a–220b, and read lines (not shown) during read or write operations. Magnetic memory elements 100a–100d are generally located at the crosspoints of the bit lines 210a–210b and word lines 220a–220b.

The read lines may be located on top of or beneath (and insulated from) the bit lines 210a–210b or the word lines 220a–220b, or any other suitable configuration according to a particular implementation.

Conventional magnetic memory elements as described above may be written when currents in the bit line and word line intersecting at a selected memory element generate enough combined magnetic fields to switch the magnetic orientation of the data layer of the selected memory element. It is known that when a magnetic memory element is heated (e.g., to a temperature higher than room temperature), the magnetic orientation of the data layer can be more easily switched (e.g., by a smaller combined magnetic field). Thus, thermally assisting switching of magnetic orientations in memory elements is often a desirable feature.

Thermal-assistance is typically provided by additional heater structures contacting or nearby the memory elements. These heater structures are typically formed for the sole purpose of heating its proximate memory element. Forming additional heater structures, however, incurs additional fabrication costs.

Thus, a market exists for an alternative method to heat memory elements without necessarily forming additional heater structures.

SUMMARY

An exemplary magnetic random access memory comprises a plurality of hardmasks, a plurality of magnetic memory elements each having been formed using a corresponding one of the hardmasks, and at least one conductor near the hardmasks. The conductor is capable of carrying a current to generate radio frequency electromagnetic fields absorbable by the hardmasks to heat the hardmasks to elevate the temperature of one or more of the magnetic memory elements to thermally assist in switching a magnetic orientation thereof.

Other embodiments and implementations are also described below.

BRIEF DESCRIPTION OF THE FIGURES

FIGS. 3A and 3B respectively illustrate exemplary coercivity at room temperature, and exemplary coercivity at an elevated temperature for switching the magnetic orientation of a magnetic memory element.

DETAILED DESCRIPTION

I. Overview

Section II describes exemplary effects of heat on the coercivity of a magnetic memory element.

Section III describes an exemplary magnetic memory structure which does not require a separate heater structure.

Section IV describes an exemplary process for making the magnetic memory structures described in Section III.

Section V describes an exemplary top view of the multiple magnetic memory structures described in Section III.

Section VI describes exemplary applications of the exemplary magnetic memory structures described in Section III.

II. Exemplary Effects of Heat on Coercivity

In many conventional MRAMs, a "1" or a "0" is written into a memory element by switching the magnetic orientation of the data layer in the memory element. The magnetic orientation is typically switched by (the vector sum of) magnetic fields resulting from write currents ($I_x$, $I_y$) flowing in two orthogonal write conductors (i.e., a bit line and a word line), one above and one below the memory element. The selected memory element experiences a bit line field and a word line field, while other memory elements on the selected row and column experience only one of the bit line field and word line field.

In a thermally-assisted MRAM, a selected memory element is heated just prior to or during a write operation. As a result of the increased heat, the coercivity (i.e., the ease of switching the magnetic orientation of the memory element) of the heated memory element is reduced and smaller switching magnetic fields are required to write that memory element.

FIG. 3A illustrates an exemplary graph of coercivity (Hc) at room temperature and FIG. 3B illustrates an exemplary graph of coercivity (Hc) at an elevated temperature (e.g., 50 degrees C. above room temperature). At the elevated temperature, the magnetic orientation of the data layer of a magnetic memory element switches at a lower combined magnetic field. Therefore, heating a magnetic memory element allows the magnitudes of one or both of the write currents ($I_x$, $I_y$) to be reduced. But even if the magnitudes of one or more write currents are not reduced, a heated magnetic memory element will switch more reliably than an unheated magnetic memory element in the presence of a combined magnetic field. Thus, the degree of heating of a selected magnetic memory element, and the write currents applied to the memory element, can be adjusted (e.g., traded off) depending on a desired switching reliability.

Figure 1:
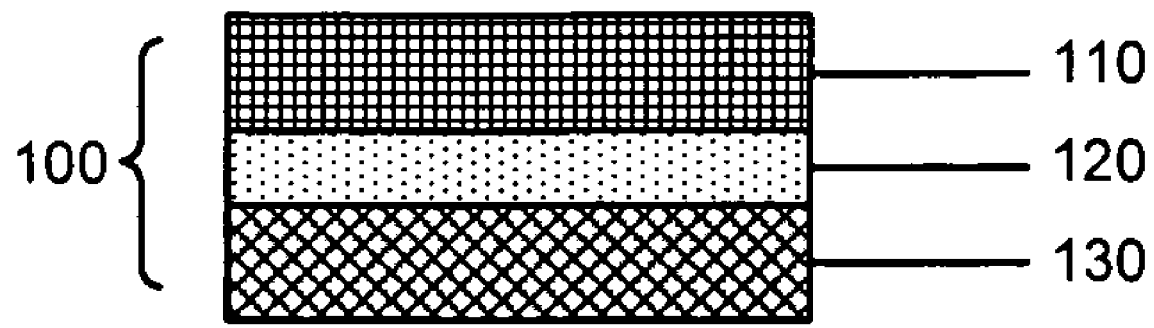
FIG. 1 illustrates an exemplary magnetic memory element in the related art.
Figure 2:
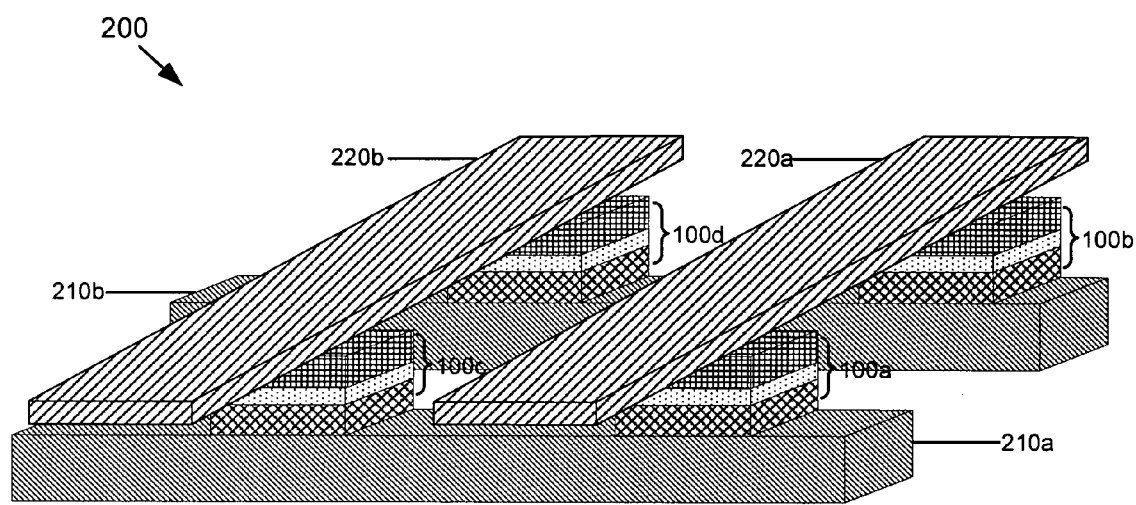
FIG. 2 illustrates an exemplary memory array having a plurality of magnetic memory elements in the related art.
Figure 4:
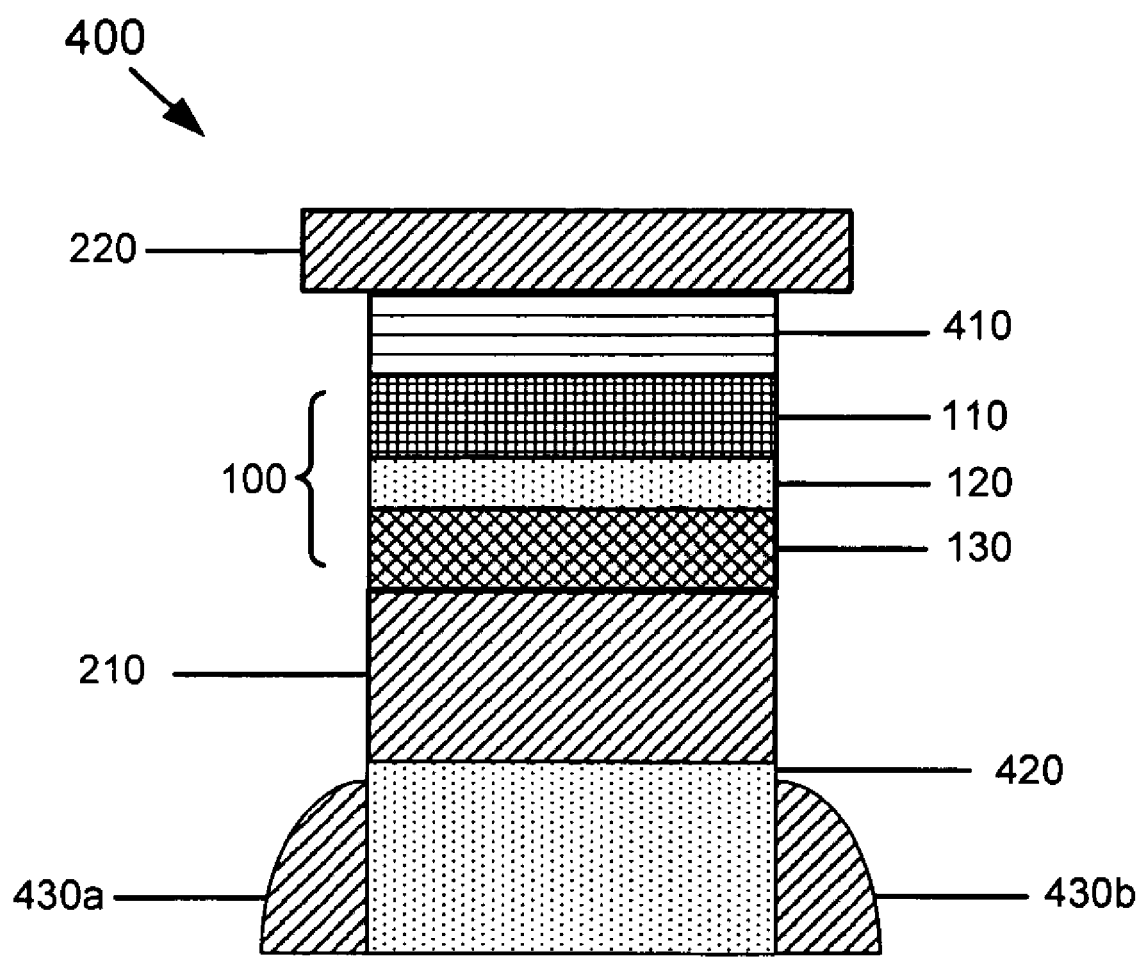
FIG. 4 illustrates an exemplary cross-sectional view of a magnetic memory structure having a hardmask that was used to form a magnetic element during a fabrication process, and can subsequently be used to heat the memory element.

III. An Exemplary Magnetic Memory Structure that does not Necessarily Require a Separate Heating Structure FIG. 4 illustrates an exemplary magnetic memory structure 400 that includes a hardmask which can function both as a mask to pattern and form the magnetic memory element during device fabrication, and then subsequently, as a heater to heat the magnetic memory element. Thus, a separate heater structure is not necessary for providing thermal assistance to the magnetic memory element 100, for example, during a write operation.

The memory structure 400 includes a magnetic memory element 100 (which includes a data layer 110, a spacer layer 120, and a reference layer 130), a hardmask 410 above the magnetic memory element 100, a first write conductor 210 (e.g., a bit line) and a second write conductor 220 (e.g., a word line), a pair of additional conductors 430a–430b, and an insulating material (e.g., dielectric) 420 for insulating the first write conductor 210 from the additional conductors 430a–430b.

The hardmask 410 is used to pattern the memory element 100 during device fabrication (e.g., using a photolithographic process known in the art) and is not removed after the patterning process. Magnetic memory elements 100 patterned by hardmasks 410 may have a more consistent shape than elements patterned by organic masks.

In general, a hardmask is relatively more difficult to etch away than organic photoresist. Exemplary hardmask materials may include amorphous C, TaN, SiC, SiNx, and SiOx. In the memory structure 400, the hardmask 410 comprises one or more materials capable of absorbing energy from radio frequency electromagnetic fields, such as carbon-like diamond. Diamond-like carbon is thermally, electrically, and structurally stable, even at temperatures as high as 400° C.

In an exemplary implementation, the lateral dimensions of the hardmask 410 are substantially the same as the magnetic memory element. The thickness of the hardmask 410 is dependent on the etch rate or other considerations (e.g., the material used). A diamond-like carbon hardmask can be very thin, for example, on the order of 10–100 nanometers.

The hardmask 410 may be electrically conductive. In an exemplary embodiment, the hardmask can have a resistance between about 0.5% and 50% of resistance relative to the resistance of the memory element 100. In an exemplary implementation, the hardmask 410 can also function as a linear resistive element. The resistivity of the hardmask 410 can vary by orders of magnitude, depending upon deposition conditions. For example, the resistivity of diamond-like carbon can vary with the degree of nitrogen (N) doping during deposition of the hardmask 410. Resistance provided by the hardmask 410 can be useful to prevent a single shorted magnetic memory element from causing a column-wide (or row-wide) error. This and other advantages relating to implementing a hardmask 410 as an additional resistive element are described in more detail in U.S. Pat. No. 6,633,497, to Nickel, and assigned to the same assignee as the present application, which patent is hereby incorporated by reference for all purposes.

In an exemplary implementation, if the hardmask 410 is electrically conductive, an insulating layer (not shown) may be formed between the hardmask 410 and the second conductor 220.

The hardmask 410 may (but need not) contact the data layer 110 (e.g., there may be other layers between the hardmask 410 and the data layer 110) so long as the hardmask 410 is located near enough to heat the data layer 110 of the magnetic memory element 100, for example, immediately prior to or during a write operation.

In an exemplary implementation, the additional conductors 430a–430b comprise one or more conductive materials such as Cu, Al, AlCu, Ta, W, Au, Ag, alloys of one or more of the above, and/or other conductive material(s) and alloy(s).

The physical configurations of the additional conductors 430a–430b illustrated in FIG. 4 are merely exemplary. One skilled in the art will readily appreciate that the additional conductors 430a–430b can be implemented proximate to (e.g., in the vicinity of, near, etc.) the hardmask 410 so that the radio frequency electromagnetic fields emanating from the conductors can be effectively absorbed by the hardmask 410 to heat the hardmask 410 to a desired temperature.

Memory structures having additional layers are also known in the art and may be implemented in various embodiments to be described herein in accordance with a particular design choice. For example, another magnetic memory structure may also include a seed layer, an antiferromagnetic (AFM) layer, a protective cap layer, and/or other layers. The seed layer enhances crystalline alignment within the AFM layer. Exemplary materials for a seed layer include Ta, Ru, NiFe, Cu, or combinations of these materials. The AFM layer enhances magnetic stability in the reference layer 130. Exemplary materials for an AFM layer include IrMn, FeMn, NiMn, PtMn, and/or other well known materials. The protective cap layer protects the data layer 110 from the environment (e.g., by reducing oxidation of the data layer 110) and may be formed using any suitable material known in the art. Exemplary materials for a protective cap layer include Ta, TaN, Cr, Al, Ti, DLC and/or still other materials. For ease of explanation, these additional layers are not shown in the Figures.

The write conductors 210 and 220 may be made of Cu, Al, AlCu, Ta, W, Au, Ag, alloys of one or more of the above, and/or other conductive material(s) and alloy(s). The write conductors 210 and 220 may be formed by deposition or other techniques known in the art (e.g., sputtering, evaporation, electroplating, etc.). The write conductors 210 and 220 illustrated in FIG. 4 are merely exemplary. Those skilled in the art will appreciate that other configurations can also be implemented in accordance with any particular design choice. For example, one or more write conductors 210 and 220 may be at least partially cladded by a ferromagnetic cladding material, or thermally insulated from the memory element 100 by an insulating material (e.g., dielectric, air, a vacuum, etc.), etc. If a cladding is implemented, the cladding may comprise one or more materials having low thermal conductivity (e.g., amorphous metallic, doped semiconductor, and/or other materials or alloys) and/or ferromagnetic properties. If a cladding is implemented, for example, in the first write conductor 210, the memory element 100 may make electrical contact with a portion of the cladding instead of the write conductor 210 to reduce heat transfer through the write conductor 210.

The data layer 110 may comprise one or more ferromagnetic materials. In an exemplary embodiment, ferromagnetic materials suitable for the data layer 110 include, without limitation, NiFe, NiFeCo, CoFe, amorphous ferromagnetic alloys (e.g., CoZrNb, CoFeB), and other materials. In an exemplary implementation, the data layer 110 comprises a ferromagnet (FM) in contact with an antiferromaget (AFM). By coupling a FM layer to an AFM layer, a desired temperature dependence of the data layer coercivity may be obtained. For example, high coercivity may be achieved at room temperature due to a large FM-AFM exchange anisotropy. High room temperature coercivity may prevent inadvertent writing of unselected memory elements on selected rows and/or columns. Examples of AFM materials include, without limitation, iridium manganese (IrMn), iron manganese (FeMn), nickel manganese (NiMn), nickel oxide (NiO), platinum manganese (PtMn), and/or other materials.

In an exemplary embodiment, the spacer layer 120 is a tunnel barrier layer (e.g., if the memory element 100 is a TMR memory element). In this embodiment, the spacer layer 120 may be made of $SiO_2$, $SiN_x$, MgO, $Al_2O_3$, $AlN_x$, and/or other insulating materials.

In another exemplary embodiment, the spacer layer 120 is a non-magnetic conductive layer (e.g., if the memory element 100 is a GMR memory element). In this embodiment, the spacer layer 120 may be made of Cu, Au, Ag, and/or other non-magnetic conductive materials.

The reference layer 130 may comprise a single layer of material or multiple layers of materials. For example, the reference layer 130 may comprise one or more ferromagnetic materials. In an exemplary embodiment, ferromagnetic materials suitable for the reference layer 130 include NiFe, NiFeCo, CoFe, amorphous ferromagnetic alloys (e.g., CoZrNb, CoFeB), and other materials.

In generally, a memory structure may be made in a top-pinned configuration (where the reference layer 130 is on top of the data layer 110) or a bottom-pinned configuration (where the reference layer 130 is below the data layer 110). For ease of explanation, FIG. 4 illustrates an exemplary bottom-pinned configuration. One skilled in the art will recognize that other configurations (e.g., top-pinned) may be alternatively implemented. For example, in a top-pinned configuration, the hardmask 410 can be located adjacent to the reference layer 130 instead.

Figure 5:
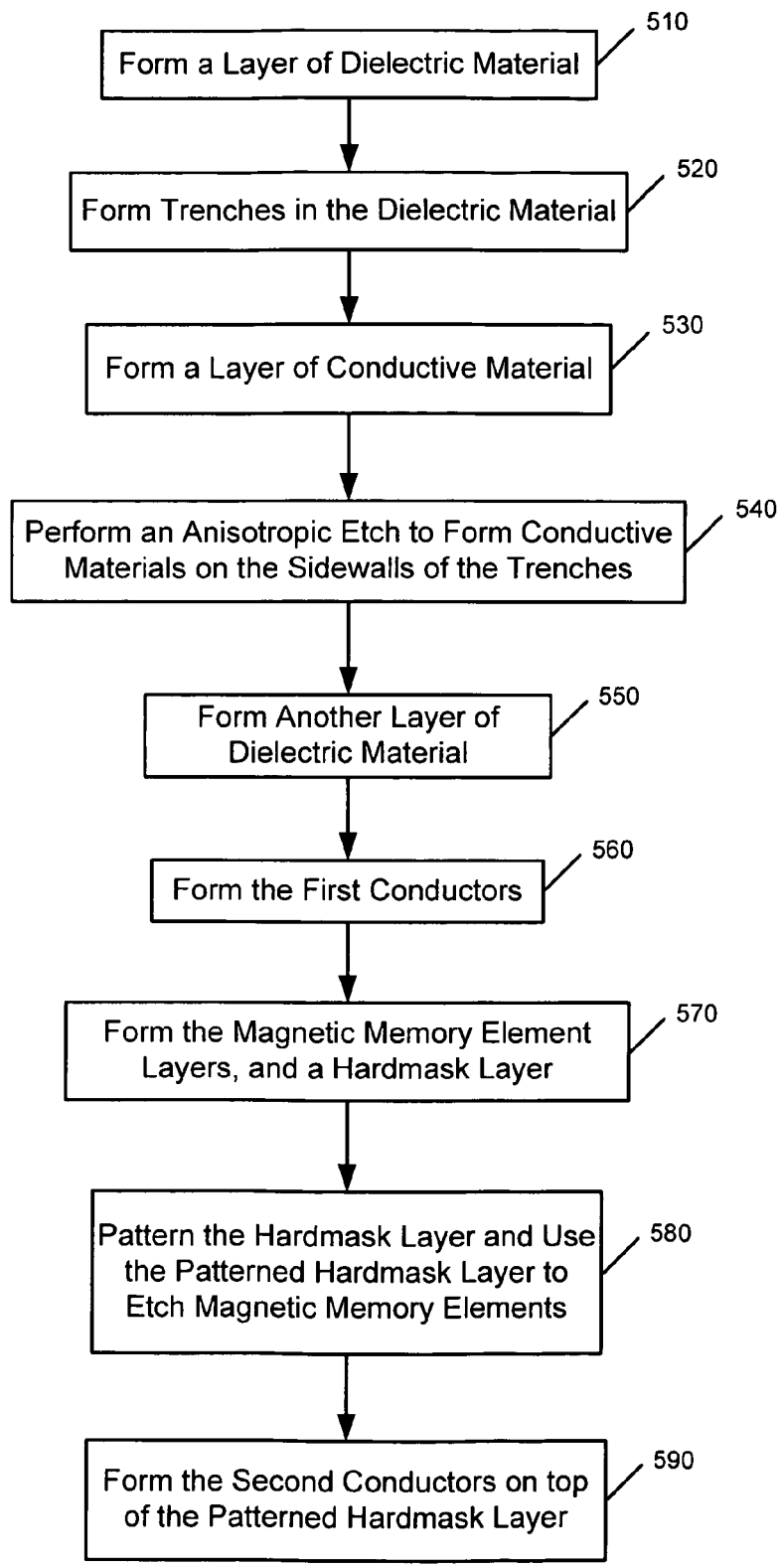
FIG. 5 illustrates an exemplary process for forming the magnetic memory structure of FIG. 4.

FIG. 5 below describes an exemplary process for making the memory structure 400.

VI. An Exemplary Process to Make the Magnetic Memory Structure of FIG. 4

FIG. 5 illustrates an exemplary process for making the magnetic memory structure 400. FIGS. 6A–6I illustrate exemplary magnetic memory structures being made in accordance with the process steps of FIG. 5.

Figure 6A:
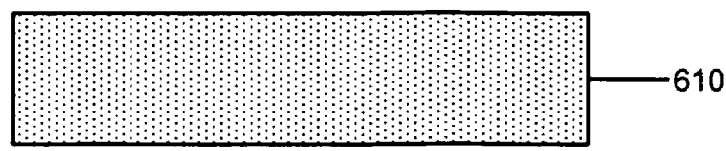
FIGS. 6A–6I illustrate exemplary magnetic memory structures being fabricated in accordance with the exemplary process of FIG. 5.

At step 510, a layer of dielectric material is formed by deposition or other similar techniques known in the art. In an exemplary implementation, the dielectric material formed is planarized by a planarizing process such as chemical mechanical planarization (CMP). An exemplary layer of planarized dielectric material 610 is illustrated in FIG. 6A.

Figure 6B:
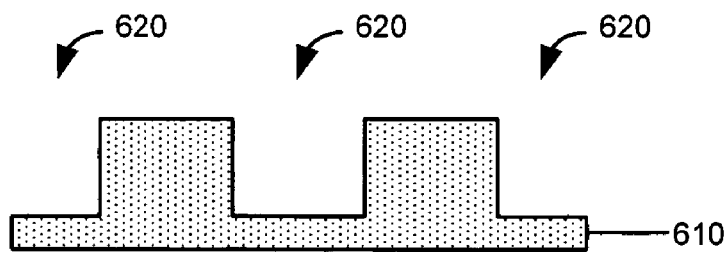

At step 520, trenches are formed in the dielectric material by a dry or wet etch process known in the art. FIG. 6B illustrates the exemplary layer of dielectric material 610 with trenches 620.

Figure 6C:
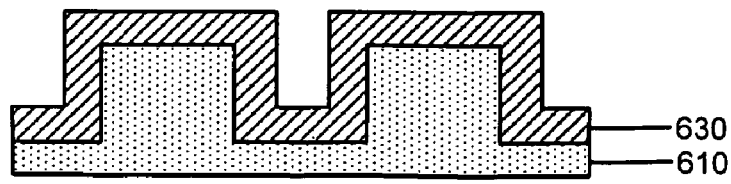

At step 530, a layer of conductive material is formed by deposition or other similar techniques known in the art. FIG. 6C illustrates an exemplary layer of conductive material 630 above the layer of dielectric material 610.

Figure 6D:
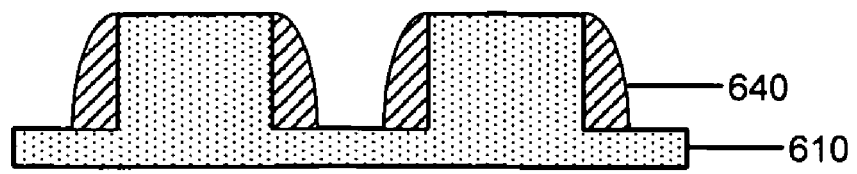

At step 540, an anisotropic etch is performed to differentially etch the conductive material. In an exemplary implementation, the anisotropic etch removes the conductive materials on the top and bottom surfaces but leaves the conductive materials on the sidewalls of the trenches substantially intact. Techniques for performing anisotropic etches are well known in the art and need not be described in detail herein. FIG. 6D illustrates exemplary conductive materials 640 on the sidewalls of the trenches.

Figure 6E:
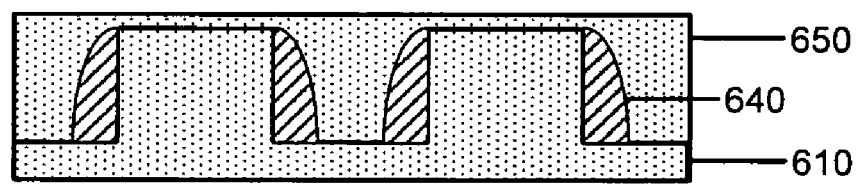

At step 550, another layer of dielectric material is formed by deposition or other similar techniques known in the art. In an exemplary implementation, the dielectric material formed is planarized by a planarizing process such as chemical mechanical planarization (CMP). FIG. 6E illustrates another layer of planarized dielectric material 650 formed on top of the conductive materials 640 and the first layer of dielectric material 610.

Figure 6F:
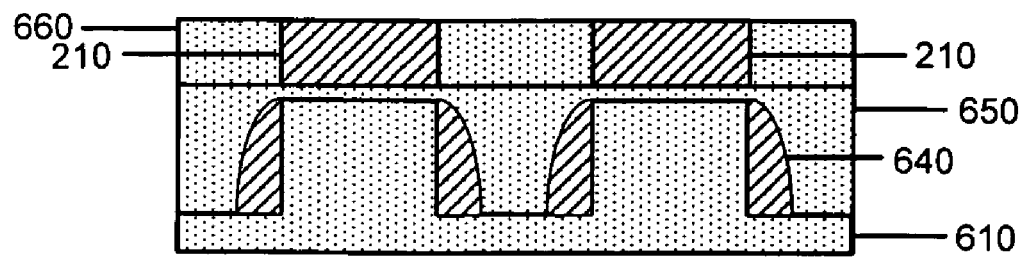

At step 560, the first conductors 210 are formed in accordance with techniques known in the art. In an exemplary implementation, the first conductors are insulated from each other by a dielectric layer. FIG. 6F illustrates first conductors 210 being insulated from each other by a dielectric layer 660.

Figure 6G:
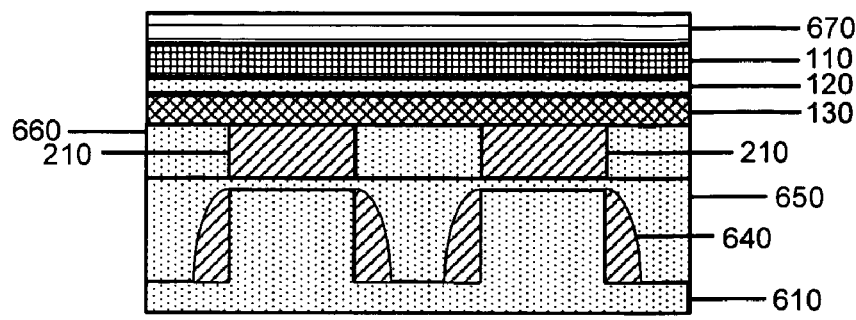

At step 570, materials for forming the magnetic memory elements and a hardmask layer are formed by deposition techniques known in the art. In an exemplary implementation, the magnetic memory elements include a reference layer 130, a spacer layer 120, and a data layer 110, deposited in the stated order (for a bottom-pinned configuration). FIG. 6G illustrates the magnetic memory element layers 110–130 above the first conductors 210 and a hardmask layer 670 above the data layer 110.

Figure 6H:
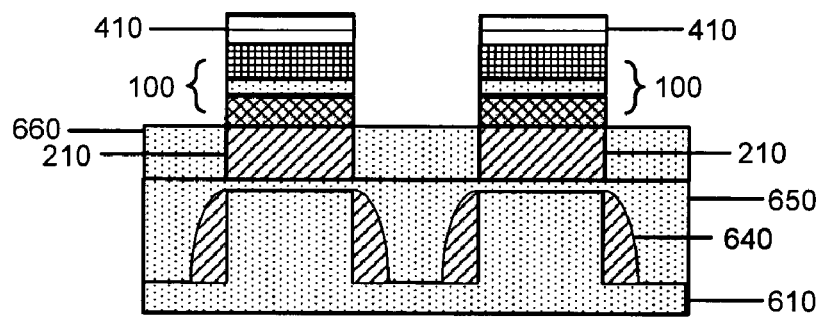

At step 580, the hardmask layer 670 is patterned by photolithographic patterning techniques known in the art to form hardmasks having substantially the same dimensions as the (desired) magnetic memory elements and the hardmasks 410 are used to form the magnetic memory elements 100. FIG. 6H illustrates exemplary memory elements 100 patterned and formed by using the hardmasks 410 as a mask.

Figure 6I:
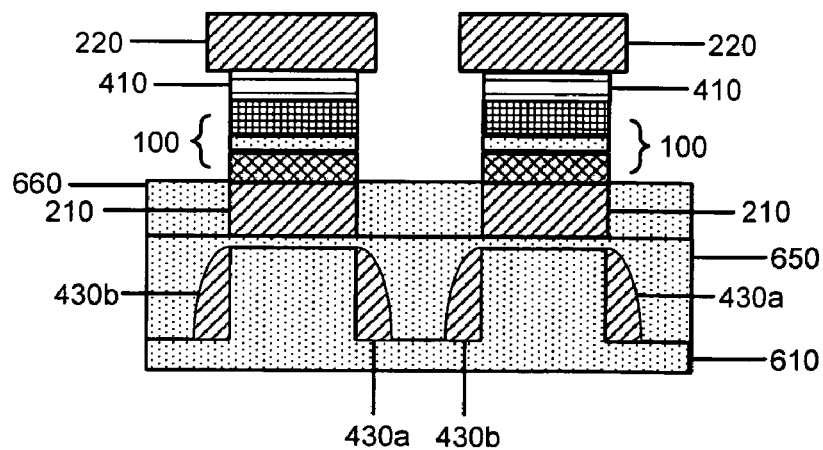

At step 590, the second conductors 220 are formed above the hardmasks 410 using techniques known in the art. In an exemplary implementation, a layer of dielectric material (not shown) is formed to isolate the magnetic memory elements from each other then etched (e.g., via CMP) to expose the top of the magnetic memory elements prior to forming the second conductors 220. FIG. 6I illustrates exemplary magnetic memory structures similar to structure 400 of FIG. 4. In FIG. 6I, the conductive materials 640 can be coupled to a decoder and a power source (shown in FIG. 7) to form additional conductors 430a–430b.

For ease of explanation, only the bottom-pinned configuration is shown in FIG. 6I. One skilled in the art will readily appreciate that the top-pinned configuration may alternatively be implemented using the exemplary processes disclosed herein in accordance with any particular design requirement.

V. An Exemplary Top View of an Exemplary Array of Magnetic Memory Structures

Figure 7:
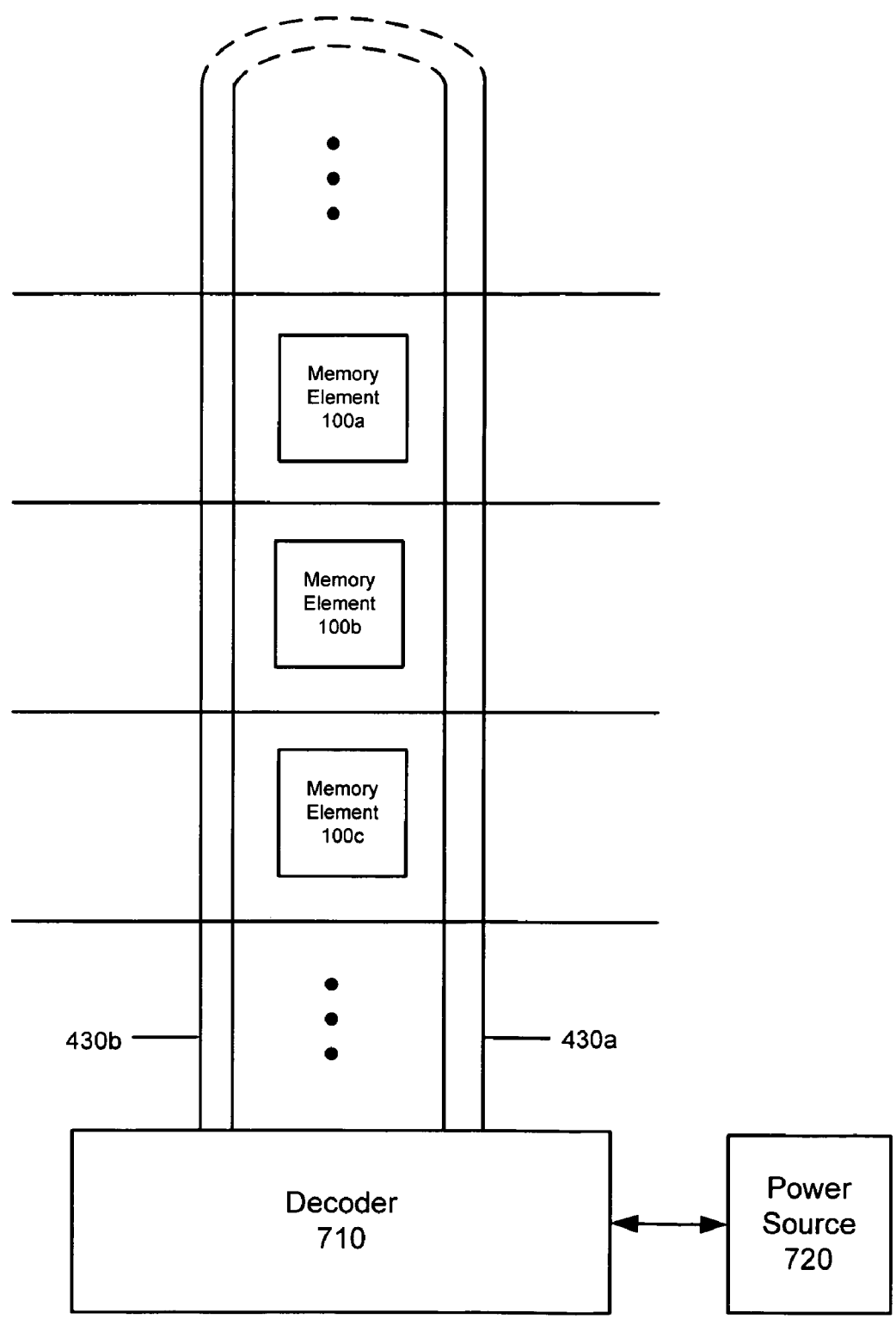
FIG. 7 illustrates an exemplary top view of an array of magnetic memory structures having additional conductors near an array of magnetic memory elements.

FIG. 7 illustrates an exemplary top view of additional conductors 430a–430b being formed near an array of magnetic memory elements 100a–100c. For ease of explanation, various other elements in the magnetic memory structures are not shown (e.g., the write conductors, hardmasks, various layers of the magnetic memory elements, etc.).

The additional conductors 430a–430b are connected (at one end) to a decoder 710 and a power source 720 for providing a current at a radio frequency usable for heating hardmasks 410 (not shown) near the magnetic memory elements 100a–100c. In an exemplary implementation, for each row (or column) of magnetic memory elements, the additional conductors 430a–430b are connected (at another end) to each other. Thus, when a magnetic memory element in a row is selected (e.g., in a write operation), the decoder 710 coupled with the power source 720 will supply sufficient current to the additional conductors 430a–430b of that row to heat all the hardmasks in the row. In an exemplary write operation, separate write currents will be supplied in the write conductors 210 and 220 (not shown) that intersect at the selected magnetic memory element. The combined magnetic fields emanating from both the intersecting write conductors 210 and 220 will effectively switch the magnetic orientation of the selected (and heated) memory element. The other (heated) magnetic memory elements in the row having heated hardmasks will experience magnetic field emanating from only one of the two write conductors 210 and 220, which is not sufficient to switch their magnetic orientation.

VI. Exemplary Applications of the Exemplary Magnetic Memory Structures

The exemplary magnetic memory structures described herein may be implemented in any MRAM. A MRAM can be implemented in any system that requires a non-volatile memory. For example, a MRAM may be implemented in a computer, a digital camera, and/or other computing systems having a processor and an interface module.

VII. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims.

What is claimed is:

1. A magnetic random access memory comprising:
    a plurality of hardmasks;
    a plurality of magnetic memory elements each having been formed using a corresponding one of said hardmasks; and
    at least one conductor near said hardmasks, said conductor being capable of carrying a current to generate radio frequency electromagnetic fields absorbable by said hardmasks to heat said hardmasks to elevate the temperature of one or more of said magnetic memory elements to thermally assist in switching a magnetic orientation thereof.

2. The memory of claim 1, further comprising a decoder coupled to said conductor and operable to select one or more of said magnetic memory elements for heating.

3. The memory of claim 1, wherein said hardmasks include diamond-like carbon.

4. The memory of claim 1, wherein said magnetic memory element comprises a data layer, a spacer layer, and a reference layer.

5. The memory of claim 4, wherein said hardmask is adjacent to said data layer.

6. The memory of claim 4, wherein said data layer is characterized in that its magnetic coercivity becomes reduced when its temperature becomes elevated.

7. A method for writing data to a thermally-assisted magnetic memory element in an array of memory elements, comprising:
    heating a hardmask corresponding to a selected memory element, said hardmask:
        having previously been used to pattern said selected memory element during fabrication of said array;
        being heated by absorbing energy from a radio frequency electromagnetic field near said hardmask; and
        thereby elevating the temperature of said selected memory element to reduce the magnetic coercivity of said selected memory element; and applying a write current sufficient to switch the magnetic state of said selected memory element at said reduced magnetic coercivity.

8. The method of claim 7, further comprising providing said radio frequency electromagnetic field via a conductor near said hardmask.

9. The method of claim 8, further comprising using a decoder coupled to said conductor to select said magnetic memory element for heating.

10. The method of claim 7, wherein said hardmask comprises diamond-like carbon.

11. The method of claim 7, wherein said hardmask is adjacent to a data layer of said selected memory element.

12. A method for making a thermally-assisted magnetic memory structure, comprising:
forming a hardmask;
patterning a memory element using said hardmask; and
forming at least one conductor for supplying a radio frequency electromagnetic field to heat said hardmask;
such that during a subsequent data storage operation, said hardmask can be heated by absorbing energy from said radio frequency electromagnetic field, thereby thermally assisting in switching the magnetic state of said memory element upon application of a write current.

13. The method of claim 12, further comprising:
forming read and write conductors for performing read and write operations on said memory element.

14. The method of claim 12, wherein said hardmask comprises a material able to absorb energy from said radio frequency electromagnetic field.

15. The method of claim 14, wherein said material includes diamond-like carbon.

16. The method of claim 12, wherein said hardmask is adjacent to a data layer of said memory element.

17. The method of claim 16, wherein said heating effects a reduction in the magnetic coercivity of said data layer.

18. A nonvolatile memory array comprising a plurality of thermally-assisted magnetic memory structures, each of said magnetic memory structures being made by a process comprising:
forming a hardmask;
patterning a memory element using said hardmask; and
forming at least one conductor for supplying a radio frequency electromagnetic field to heat said hardmask;
such that during a subsequent write operation, said hardmask can be heated by absorbing energy from said radio frequency electromagnetic field, thereby thermally assisting in switching the magnetic state of said memory element upon application of a write current.

19. An apparatus for writing data to a thermally-assisted magnetic memory element in an array of memory elements, comprising:
means for heating a hardmask near a selected memory element to reduce its magnetic coercivity; said hardmask:
having previously been used to pattern said selected memory element during fabrication of said memory element; and
being heated by absorbing energy from a radio frequency electromagnetic field in the vicinity of said hardmask; and
means for applying a write current sufficient to switch the magnetic state of said selected memory element at said reduced magnetic coercivity.

* * * * *